United States Patent [19]

Bapat

[11] 3,912,948

[45] Oct. 14, 1975

[54] MOS BOOTSTRAP INVERTER CIRCUIT

[75] Inventor: Dilip C. Bapat, Mountain View, Calif.

[73] Assignee: National Semiconductor Corporation, Santa Clara, Calif.

[22] Filed: Aug. 30, 1971

[21] Appl. No.: 176,128

[52] U.S. Cl. .................. 307/279; 307/214; 307/205

[51] Int. Cl.[2] ................... H03K 3/281; H03K 19/40

[58] Field of Search ............ 307/205, 279, 251, 214

[56] References Cited

UNITED STATES PATENTS

| | | | |
|---|---|---|---|
| 3,480,796 | 11/1969 | Polkinghorn et al. | 307/279 X |
| 3,509,379 | 4/1970 | Rapp | 307/279 |
| 3,622,798 | 11/1971 | Ochi | 307/251 X |
| 3,626,210 | 12/1971 | Spence | 307/205 X |
| 3,673,471 | 6/1972 | Klein et al. | 317/235 B |
| R27,305 | 3/1972 | Polkinghorn et al. | 307/251 |

*Primary Examiner*—John S. Heyman
*Attorney, Agent, or Firm*—Lowhurst, Aine & Nolan

[57] ABSTRACT

An MOS bootstrap inverter circuit including at least four FET devices wherein one of the FET devices serves as an inverting amplifier, a second FET device serves as an active load for the inverting amplifier, a third FET device serves as a biasing means for the active load, and the gate-to-channel capacitance of a fourth FET device is used as a bootstrapping feedback element for the active load.

4 Claims, 4 Drawing Figures

INVENTOR
DILIP C. BAPAT
BY
Lowhurst & Hamrick
ATTORNEYS

INVENTOR
DILIP C. BAPAT
BY
Lowhurst & Hamrick
ATTORNEYS

MOS BOOTSTRAP INVERTER CIRCUIT

BACKGROUND OF THE INVENTION

1. Field of the Invention

The present invention relates generally to metal-oxide-semiconductor (MOS) integrated circuitry and more particularly to a bootstrap inverter circuit utilizing the gate-to-channel capacitance of an FET to provide improved bootstrapping operation.

2. Discussion of the Prior Art

In prior art MOS bootstrap inverter circuits, an MOS capacitor comprised of a metal layer and diffused semiconductor region separated by a layer of thick oxide, is typically used to provide a bootstrapping circuit element for feedback coupling the source and gate of an active load device. The use of this type of capacitor is subject to the disadvantages that (1) it makes the use of silicon gate technology difficult, (2) the capacitor itself occupies a relatively large portion of wafer area, and (3) it results in the formation of excessive parasitic capacitance which slows operation of the circuit.

The first disadvantage is due to the fact that most silicon gate techniques used to make P-channel devices do not allow the formation of a p-type region beneath a body of polysilicon material, since the polysilicon body is usually formed prior to making the p-type depositions and thus serves to mask off those portions of the substrate surface lying directly therebeneath. The second disadvantage is that since the upper plate of the MOS capacitor is formed by a portion of the contact metallization, the dielectric oxide which separates it from the underlying substrate surface is relatively thick and thus the physical size of the capacitive "plates", both lower diffusion and upper metallization, must be made correspondingly large to achieve the necessary capacitance. The third disadvantage naturally follows from the second and is due to the large amount of parasitic junction capacitance which accompanies the relatively large pn junction formed by the lower diffusion.

SUMMARY OF THE PRESENT INVENTION

It is therefore an object of the present invention to provide an improved MOS bootstrap inverter circuit wherein a thin oxide device is used to form a bootstrapping capacitor for the circuit.

Another object of the present invention is to provide an improved MOS bootstrap inverter circuit wherein the gate-to-channel capacitance of an FET is used to provide a bootstrapping feedback path for an active load element.

Still another object of the present invention is to provide an improved MOS bootstrap inverter circuit using silicon gate devices, and wherein the gate-to-channel capacitance of a silicon gate FET is used to provide a bootstrapping feedback path for an active load element.

Briefly, a preferred embodiment of the present invention comprises an MOS bootstrap inverter circuit including at least four FET devices wherein one of the FET devices serves as an inverting amplifier, a second FET device serves as an active load for the inverting amplifier, a third FET device serves as a biasing means for the active load, and the gate-to-channel capacitance of a fourth FET device is used as a bootstrapping feedback element for the active load.

Among the advantages of the present invention are that all devices in the circuit may be made using silicon gate techniques, the circuit may be constructed using a minimum of wafer area, and the parasitic capacitance associated with the bootstrapping feedback path is held to a minimum. These and other advantages of the present invention will no doubt become apparent to those of ordinary skill in the art after having read the following detailed description of a preferred embodiment which is illustrated in the several figures of the drawing.

IN THE DRAWING

DETAILED DESCRIPTION OF THE PREFERRED EMBODIMENT

Figure 1:
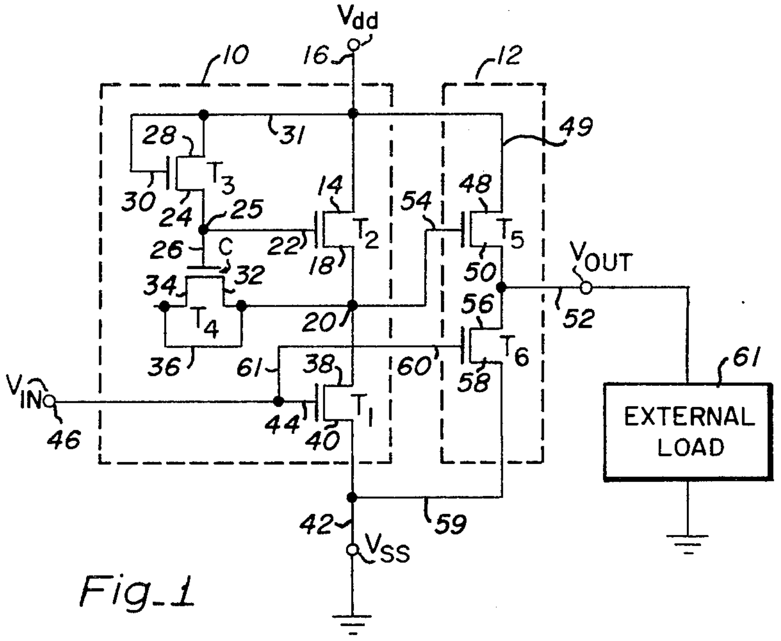
FIG. 1 is a circuit diagram illustrating an improved MOS bootstrap inverter circuit in accordance with the present invention.

Referring now to FIG. 1 of the drawing, a simplified schematic diagram is provided showing a bootstrap inverter circuit 10 and buffer stage 12 in accordance with the present invention. Inverter circuit 10 includes an inverting amplifier formed by an FET $T_1$, an active load for $T_1$ formed by an FET $T_2$, a biasing means for $T_2$ formed by an FET $T_3$, and a fourth FET $T_4$ whose gate-to-channel capacitance is included in a bootstrapping feedback path coupling the gate and source of transistor $T_2$. The drain 14 of transistor $T_2$ is coupled to a first source of potential $V_{dd}$ at terminal 16 while the source 18 of $T_2$ is coupled to the source 24 of transistor $T_3$ and to the gate 26 of transistor $T_4$.

The drain 28 and gate 30 of $T_3$ are coupled to $V_{dd}$ at terminal 16 by a lead 31. The source 32 of transistor $T_4$ is coupled to the inverter circuit output terminal (node 20), and the drain 34 of $T_4$ is preferably electrically shorted to the source 32, either internally by a continuous deposition or externally by a metallic interconnect 36. However, it is not absolutely necessary that drain 34 be shorted to source 32 and it may alternatively be left unconnected. The drain 38 of transistor $T_1$ is coupled to output terminal 20, and the source 40 of $T_1$ is coupled to a second source of potential $V_{ss}$ at terminal 42. The gate 44 of $T_1$ is coupled to a circuit input terminal 46.

Buffer stage 12 is in effect an active push-pull amplifier including a load charging means formed by an FET $T_5$ and the source of potential $V_{dd}$, and a load discharging means formed by an FET $T_6$ and the second source of potential $V_{ss}$. The drain 48 of transistor $T_5$ is coupled to $V_{dd}$ at terminal 16 by a lead 49, while the source 50 of $T_5$ is coupled to inverter circuit output node 20. The drain 56 of transistor $T_6$ is coupled to buffer output terminal 52 while the source 58 of $T_6$ is coupled by lead 59 to $V_{ss}$ at terminal 42. The gate 60 of $T_6$ is coupled to input terminal 46 by a lead 61. The function of transistors $T_5$ and $T_6$ is to alternately charge and discharge the external load 61 without consuming DC power. No measurable power is consumed by the buffer stage itself since one of transistors $T_5$ and $T_6$ is always nonconductive when the other is conductive, and accordingly no DC path between $V_{dd}$ and $V_{ss}$ is established. There is, of course, some transient loss, but this is minimal.

Figure 2:
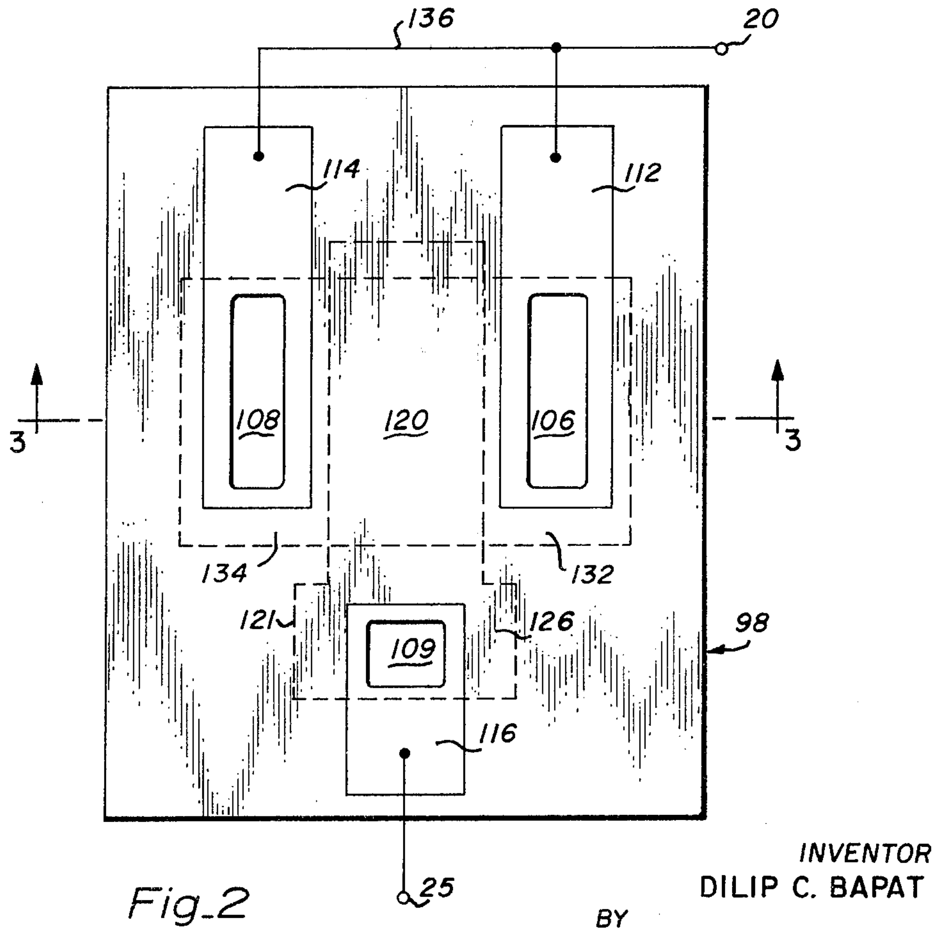
FIG. 2 is a plan view of a silicon gate FET connected to operate as a bootstrap capacitor for the embodiment illustrated in FIG. 1.
Figure 3:
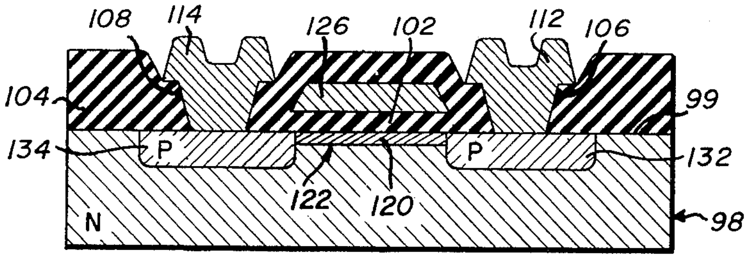
FIG. 3 is a cross section through the FET of FIG. 2 taken along the line 3—3.

In accordance with the present invention, each of the transistors $T_1$–$T_6$ is comprised of a silicon gate device of the type disclosed in the article entitled "Silicon Gate Technology" by F. Faggin and T. Klein; *Solid State Electronics*, Pergamon Press, 1970; Vol. 13, pp. 1125–1144. An example of a typical silicon gate field effect transistor is illustrated in FIGS. 2 and 3 of the drawing. Although each of the transistors $T_1$–$T_6$ normally include the various illustrated component parts, this particular embodiment is shown connected in the manner that transistor $T_4$, shown in FIG. 1, is connected, i.e., as the bootstrap feedback capacitor.

Disposed in spaced apart relationship within a body of n-type substrate 98 and terminating in an upper surface 99 thereof, are a first body of p-type material, forming a source region 132, and a second body of p-type material, forming a drain region 134. Disposed above the substrate region separating source region 132 and drain region 134, and electrically isolated therefrom by a thin oxide layer 102 is a polysilicon gate 126. A thick oxide layer 104 covers the remainder of surface 99 of substrate 98 as well as the top of gate 126. However, contact openings are provided in the oxide layer 104, at 106, 108 and 109, and metallic interconnects 112, 114 and 116 extend through the respective openings to provide ohmic contacts to the source region 132, the drain region 134, and the polysilicon gate 126, respectively. Note that the polysilicon gate 126 is extended as shown at 121 so that ohmic contact may be made thereto outside of the channel region at 109. This is to eliminate the possible "pin holing" that might otherwise occur if the ohmic contact were to be made over the channel.

The device thus far described is a typical silicon gate enhancement mode FET in which the application to the gate 126 of a gate-to-source potential exceeding a threshold value $V_T$ will cause the underlying substrate to invert and form a p-type channel 120 which electrically coupled source region 132 and drain region 134. The threshold voltage $V_T$ is not a fixed value however, and differs for different source-to-substrate potentials to the "bulk effect" or "body effect" phenomenon. See "MOSFET in Circuit Design" by Robert H. Crawford; TI Electronic Series, McGraw McGraw 1967; pp. 21–50.

Since transistor $T_4$ of the FIG. 1 circuit is not intended to be operated as an FET in the usual sense, ie., as a switching means or other means of providing a voltage drop from drain to source, it is not really necessary that drain region 134 be provided. It is only necessary that at least one body of p-type material, such as region 132, be provided in the substrate surface immediately adjacent and contiguous with the substrate surface portion in which the channel 120 is formed. Such a body permits external electrical contact to be made to channel 120 so that channel 120 may be utilized as one "plate" of a capacitor including an upper plate (gate 126), a dielectric (thin oxide layer 102), and a lower plate (channel 120). Since region 132 by itself forms a suitable means for contacting channel 120, region 134 can thus be eliminated.

However, by providing the region 134, as in the usual FET, and then externally shorting region 132 to region 134, as by the illustrated external interconnect 136, (more practically, 112 and 114 are shorted by making them a unitary body) the effects associated with the distributed resistance of the channel can be reduced and thus the RC time constant of the gate-to-channel capacitance of the device can be reduced. It will, of course, be recognized that a similar and perhaps improved result could be obtained by, instead of forming two separating regions 132 and 134, forming an annular region or other circumscribing, or partially circumscribing, region about the channel 120, with such region including the surface area occupied by regions 132 and 134. As a result, the increased electrical contact provided to the periphery of channel 120 would obviously further reduce the RC time constant of the capacitive device.

Figure 4:
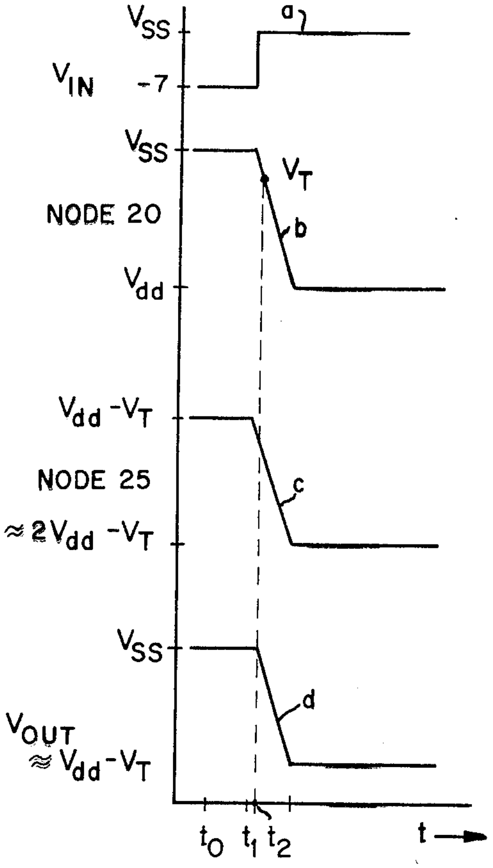
FIG. 4 is a timing diagram illustrating operation of the preferred embodiment illustrated in FIG. 1.

Operation of the circuit illustrated in FIG. 1 will now be described by referring to the timing diagram illustrated in FIG. 4 of the drawing. Where the transistors $T_1$–$T_6$ are p-channel devices, the potential source $V_{ss}$ is typically ground potential, and the potential source $V_{dd}$ is usually approximately 17 volts negative with respect to $V_{ss}$. With an input signal $V_{in}$ (in excess of a threshold potential $V_T$ for transistor $T_2$) applied to input terminal 46, the resultant charge developed on gate 44 of transistor $T_1$ will cause inversion of the underlying channel region thus causing $T_1$ to conduct and pull the potential of node 20 toward $V_{ss}$. Where $V_{in}$ substantially exceeds $V_T$, eg., $V_{in} = -7$ volts and $V = -2$ volts (see curve (*a*) at $t_o$), $T_1$ will provide an almost impedance free path between terminal 42 and node 20, so that node 20 goes to substantially $V_{ss}$ (see curve (*b*)). Since the gate 30 of transistor $T_3$ is coupled to $V_{dd}$, $T_3$ will conduct so long as the potential across its gate 30 and source 24 exceeds its threshold potential $V_T$. Accordingly, at $t_o$ node 25 will have a potential of $V_{dd}$–$V_T$, as indicated by curve (*c*). Since gate 22 of transistor $T_2$ is (at $t_o$) also at $V_{dd}$-$V_T$ and source 18 is at $V_{ss}$, $T_2$ will be conductive and will remain conductive so long as $$(V_{25} - V_{20}) \geq V_T.$$

This condition is satisfied by the charge stored in the gate-to-source capacitance C of $T_4$, since the capacitance C is formed when the gate-to-source potential of $T_4$ is equal to or greater than $V_T$.

Accordingly, if at some subsequent time $t_1$, the input signal at terminal 46 goes to ground ($V_{ss}$), turning transistor $T_1$ OFF, then current flowing through transistor $T_2$ will cause the potential at node 20 to move toward $V_{dd}$ as illustrated by curve (*b*). However, the rate at which node 20 goes to $V_{dd}$ is determined by the conductive characteristic of transistor $T_2$, which is in turn controlled by the charge on its gate 22. It will be appreciated that since the charge across the gate-to-channel of $T_4$ is $V_{dd}$–$V_T$, since node 20 was initially at approximately circuit ground ($V_{ss}$), then, as the potential at node 20 is moved toward $V_{dd}$, then the potential at node 25 must move toward $V_{dd}$-$V_T$+$V_{dd}$, or $2V_{dd}$-$V_T$, as illustrated by curve (*c*). This is, of course, assuming that the parasitic capacitance at node 25 is zero. If the parasitic capacitance is not zero, which is usually the case because of the junction capacitance at node 25 and/or the overlap between node 25 and the substrate, or between node 25 and the $V_{dd}$ buss, then the potential at node 25 will move toward $2V_{dd}$-$V_T$, but the actual final value will be less than $2V_{dd}$-$V_T$ depending upon the ratio of the parasitic capacitance to the bootstrap capacitance C. Thus, the bootstrapping action effected by the feedback through the gate-to-channel capacitance of $T_4$ will rapidly increase the gate-to-source of potential of $T_2$ as node 20 goes to $V_{dd}$.

Although the circuit output could be taken at node 20 to drive the external load 61, which is usually a large capacitive load, the resultant capacitive loading of node 20 would tend to reduce the increase in operational speed obtained by using the bootstrap circuit. Accordingly, the buffer stage 12 is used to isolate node 20 from load 61. At time $t_o$, $T_6$ is conductive since the same potential ($V_{in}$) is applied to its gate 60 as is applied to gate 44 of $T_1$. Thus, output terminal 52 is pulled to ground (see curve (*d*)) and load 61 is held in a discharged condition. At $t_1$, $T_1$ and $T_6$ are both turned OFF and node 20 begins to move toward $V_{dd}$ since $T_2$ is maintained conductive by $T_3$. However, note that since the gate 54 and source 50 of transistor $T_5$ were both at $V_{ss}$ immediately before time $t_1$, $T_5$ will not begin to conduct current from $V_{dd}$ immediately, as does $T_2$, but must wait until node 20 reaches $V_T$ at which time ($t_2$) the potential $V_{out}$ at output terminal 52 begins to move toward $V_{dd}$-$V_T$.

Assuming no leakage, the voltages at node 20 ($V_{dd}$) and output terminal 52 ($V_{dd}$-$V_T$) will remain constant until the input signal $V_{in}$ applied to terminal 46 is again returned to a negative potential sufficient to render transistors $T_1$ and $T_6$ conductive, at which time node 20 and output terminal 52 will again be pulled to the potential $V_{ss}$. More realistically however, there is a small leakage and simple holding circuits, well known in the art, are usually included, although not shown in the illustrated embodiment.

Although the present invention has been described above with particular reference to a p-channel embodiment, it will be appreciated that the disclosed principles can likewise be applied to n-channel devices, and furthermore that the gate-to-channel capacitance of an ordinary MOS FET could also be used in an appropriate circuit to form the bootstrapping circuit element. In either case, the thin oxide capacitor formed in the bootstrap circuit will reduce the parasitic junction capacitances at the node 20 and will thus improve the performance of the bootstrap inverter circuit.

While the present invention has been discussed and described with reference to a specific preferred embodiment, it is contemmplated that many alterations and modifications will become apparent to those of ordinary skill in the art after having read the foregoing description. Accordingly, it is intended that the appended claims be interpreted as covering all such alterations and modifications as fall within the true spirit and scope of the invention.

What is claimed is:

1. An MOS bootstrap inverter circuit, comprising:

an inverter output node;

an inverting amplifier responsive to an input signal and operative to develop an inverted signal at said output node;

an active load means including, a first silicon gate FET having a first gate, a first source coupled to said output node, and a first drain for connection to a first source of potential;

biasing means coupling said first gate to said first drain; and means comprising a silicon gate FET forming a capacitor and including a first body of semiconductive material of a first conductivity type having a first surface, a second body of semiconductor material of a second conductivity type disposed within said first body and terminating in said first surface, an electrically conductive body disposed opposite a surface portion of said first body lying immediately adjacent to said second body, said conductive body forming a first plate of said capacitor, a dielectric layer disposed between said conductive body and said portion, means electrically coupling said conductive body to said first gate, and means electrically coupling said second body to said output node, whereby a predetermined difference in potential between said conductive body and said first body causes said portion to invert and form a second plate of said capacitor.

2. An MOS bootstrap inverter circuit as recited in claim 1 wherein said conductive body includes a layer of polysilicon material.

3. In an MOS bootstrap inverter circuit including, an output node, an inverting amplifier responsive to an input signal and operative to develop an inverted signal at said output node, an active load means including a first silicon gate FET having a first gate and a first source coupled to said output node, and capacitive bootstrap circuit means for said active load means, an improved capacitive bootstrap circuit means, comprising:

a second silicon gate FET having a second gate coupled to said first gate, a second source coupled to said output node, and a second drain, whereby the gate-to-channel capacitance of said second FET capacitively couples said first gate to said output node.

4. In an MOS bootstrap inverter circuit as recited in claim 3 and further comprising means electrically shorting said second drain to said second source.

* * * * *